United States Patent [19]

Jones

[11] 4,407,859

[45] Oct. 4, 1983

[54] PLANAR BUBBLE MEMORY CIRCUIT FABRICATION

[75] Inventor: Addison B. Jones, Yorba Linda, Calif.

[73] Assignee: Rockwell International Corporation, El Segundo, Calif.

[21] Appl. No.: 197,740

[22] Filed: Oct. 17, 1980

[51] Int. Cl.³ .................. B44C 1/22; H01L 21/312; C03C 25/00; C03C 15/00
[52] U.S. Cl. .................. 427/89; 156/657; 156/659.1; 427/90; 427/91; 427/96; 427/130; 427/131; 427/132; 430/312; 430/314
[58] Field of Search ............... 427/89, 90, 91, 96, 427/130, 131, 132; 430/314, 312; 156/659.1, 657

[56] References Cited

U.S. PATENT DOCUMENTS

| | | | |
|---|---|---|---|
| 3,985,597 | 10/1976 | Zielinski | 427/264 X |
| 4,076,575 | 2/1978 | Chang | 156/659.1 |
| 4,187,553 | 2/1980 | Ahn et al. | 427/130 X |
| 4,226,691 | 10/1980 | Cunningham | 427/130 X |
| 4,272,348 | 6/1981 | Cox et al. | 427/130 X |
| 4,317,700 | 3/1982 | Tanaka et al. | 427/130 X |
| 4,339,305 | 7/1982 | Jones | 156/659.1 |
| 4,353,935 | 10/1982 | Symersky | 430/314 X |
| 4,358,339 | 11/1982 | Oeffinger et al. | 156/659.1 |

OTHER PUBLICATIONS

IBM Technical Disclosure Bulletin, vol. 17, No. 2, Jul., 1974.

*Primary Examiner*—Michael R. Lusignan
*Attorney, Agent, or Firm*—H. Fredrick Hamann; James F. Kirk

[57] ABSTRACT

A bubble domain device and the method of manufacturing microcircuits having multi-level conductor patterns, which includes forming on a substrate a horizontally extended first level conductor material pattern in pre-configured, relatively overwidth channels defined by a first insulator material layer on the substrate, depositing additional insulator material atop the first level conductor material, and the first insulator layer in channel backfilling relation. The additional insulator material defines a planar surface uniformly spaced above the substrate. The method then includes forming a second upper level conductor material pattern at least partially opposite the first level conductor material pattern and on the additional insulator material surface. The second upper level conductor material pattern being uniformly spaced relative to the substrate by the additional insulator material surface.

18 Claims, 9 Drawing Figures

PLANAR BUBBLE MEMORY CIRCUIT FABRICATION

BACKGROUND OF THE INVENTION

1. Field of the Invention

This invention relates to a method of fabricating microcircuit devices commonly used in home and office computers, and more particularly, has to do with a method for producing multiple level conductor material patterns in co-parallel or stacked parallel planes, embedded in insulator material, and having a constant and uniform separation between pattern levels in a manner highly advantageous for bubble memory circuit devices.

2. Description of the Prior Art

Microelectronic devices such as hybrid circuits, silicon integrated circuits, and magnetic bubble domain circuits are known in the art. These devices typically comprise components mounted on or fabricated in a substrate which is processed to provide the required circuit conductor interconnection for single-layer or multi-layer conductor patterns. Conductor patterns are typically made of aluminum copper alloy or gold. In bubble domain circuits, layers of different conductor materials such as a first level layer of aluminum copper alloy and a second layer of permalloy (nickel iron alloy) are formed on a suitable substrate, such as garnet.

Conventional bubble domain circuit devices have multi-layer, multi-level conductor patterns spaced by an insulator layer covering the first level of conductor pattern, atop the substrate of garnet. Because of the way these devices have previously been manufactured, the insulator layer varies in its spacing from the garnet substrate depending on whether the insulator area is over or between portions of the conductor material pattern. The next conductor pattern level, e.g. nickel iron alloy is applied to the insulator layer to form the bubble memory device. Variations in insulator layer spacing relative to the garnet thus are carried over to the nickel iron alloy second level pattern, and nonuniform spacing results between regions of the nickel iron alloy second level pattern and the garnet substrate.

Non-uniform spacing between the nickel iron alloy or other second level pattern and a garnet substrate, adversely affects bubble memory device performance. And, as bubble domains are scaled down in size to 2 $\mu$m or even smaller, poor device performance traceable to spacing disuniformities becomes particularly significant and will result in reduced yield of good devices in production.

In addition to these problems, layers of conductor or insulator material that contour or cross-over are subject to cracking, thinning, narrowing, and developing discontinuities at corners of the contour transition.

A further problem of significance in manufacturing multi-layer, multi-level conductor patterns is that the presence of appreciable contour in resist patterns makes difficult the obtaining of clear and distinct photo exposures, which in turn limits the obtainable minimum in line widths, the number of interconnections per unit area, and the maximum number of layers that can be achieved.

Among publications in the field is U.S. Pat. No. 3,985,597 to L. Zielinski, issued Oct. 12, 1976, which discloses a method for forming conductors embedded in dielectric to form a planar surface. See also the process disclosed in IBM Technical Disclosure Bulletin, Vol. 17, No. 12, July 1974, at page 352, copies of which are being furnished with this application.

SUMMARY OF THE INVENTION

It is, therefore, a major objective of this invention to provide a method of manufacturing multi-layer, multi-level conductor pattern devices for bubble domain circuits, and like purposes in which the several layers are uniformly spaced and in stacked parallel planar relation with themselves and with the substrate.

It is a further object of this invention to minimize a variation in spacing between the substrate and that of the planar conductor patterns thereon in semiconductor devices.

It is a particular object of this invention to provide uniform spacing between the first and second level planar conductor patterns in such devices.

It is a highly particular object of this invention to provide a method of manufacturing bubble domain structures having first and second level conductor patterns in stacked parallel planar relation embedded in dielectric on a substrate of garnet; and void-free structures produced by the method.

It is a highly particular object of this invention to provide a method of manufacturing conductor patterns of uniform conductor thickness, free of cracks, thinning, narrowing, and discontinuities at the corners of the contour or cross-over areas in stacked parallel planar relation and in bubble domain structure defining relation in void-free dielectric on a substrate of garnet.

It is a most highly particular objective of this invention to produce planar conductor patterns upon which subsequent patterns may be subjected to clear and distinct exposure, free of the distortion and imperfection common to non-planar multi-level near micromilimeter line width exposures at line cross-over points.

These and other objectives of the invention are realized in accordance with the invention in a method of manufacturing microcircuits having multi-level conductor patterns, which includes forming on the substrate a horizontally extended first level conductor material pattern in pre-configured, relatively overwidth channels defined by a first insulator material layer on the substrate, and depositing additional insulator material atop the first level conductor material and the first insulator layer in channel backfilling relation. The additional insulator material defines a planar surface uniformly spaced above the substrate. The method further includes in certain embodiments, forming a second, upper level conductor material pattern at least partially opposite the first level conductor material pattern, and on the additional insulator material surface, to be uniformly spaced thereby relative to the substrate.

In a preferred embodiment, the invention provides a method of manufacturing microcircuits having multi-level conductor patterns, which includes the steps of: (1) forming the first insulator material layer on the surface of the substrate, (2) selectively masking the first insulator material layer to define channel regions in the first insulator material, (3) etching the insulator material to define the channels and in a manner providing areas of over-etch, (4) forming a first level conductor material pattern in the channels to near coplanarity with the channel-defining first insulator material and freely of the over-etch areas, (5) backfilling the channel over-etch areas with the additional insulator material layer, and (6) forming the second level conductor material pattern across the additional insulator material backfilling the channel over-etch areas.

In stil other embodiments of the invention, following step (3), a thin layer of a further insulator material is interposed between the first level conductor pattern disposed in the first insulator material layer and the base of the channels.

In still other preferred embodiments of the invention, where more than two layers of conductor pattern are required, step (1) through (5) are repeated in sequence after step (5) for each conductor material pattern desired in excess of one. Where the topmost insulator material layer is of sufficient thickness, a preferred embodiment includes repeating step (2) through (5) in sequence after step (5) for each conductor material pattern desired in excess of one. The preferred embodiment also includes the option of forming a topmost conductor pattern on the topmost planar additional insulator surface.

In a more particularly preferred embodiment, a garnet wafer is used as the substrate. In other more particular embodiments of the invention, the method includes also defining the second level conductor material pattern with a ferro-magnetic material, including nickel iron alloys. In certain embodiments of the invention, the method includes also forming the first insulator material layer of silicon dioxide or polymer material such as polyimide.

In the more particularly preferred embodiment of the method which includes the steps of using a garnet wafer as a substrate, defining the second level conductor material pattern with a ferro-magnetic material of nickel iron alloy, and forming the first insulator material layer of silicon dioxide or polymer material, the method further contemplates the steps of masking the first insulator layer with a photoresist mask, and effecting both the etching step and the first level conductor pattern forming step through the mask.

In another particularly preferred embodiment, the method also includes applying the additional insulator material by spin-casting or dipping, and drying and sintering, a liquid suspension of glass particles simultaneously within the channels of, and upon the surface of, the first insulator material layer, to define the additional insulator material layer. The preferred method includes also after step (1), depositing a uniform layer of photoresist material on the first insulator material layer surface, and also includes after step (4), dissolving the photoresist layer and lifting off all materials thereon.

In each of the foregoing, and other embodiments of the invention, the planar bubble memory circuit fabrication method produces a bubble domain device typically comprising a first conductor material pattern disposed in a channeled, first insulator material layer on a garnet substrate, a second conductor material pattern at least partially opposite the first conductor material pattern, and additional insulator material defining a planar surface between the second conductor material pattern and the garnet substrate. In a more particular embodiment, the invention provides further insulator material interposed between the first conductor material pattern disposed in the first insulator material layer and the substrate.

BRIEF DESCRIPTION OF THE DRAWINGS

The invention will be further described as to an illustrative embodiment thereof in conjunction with the attached drawings in which.

DESCRIPTION OF THE PREFERRED EMBODIMENT

Figure 1:
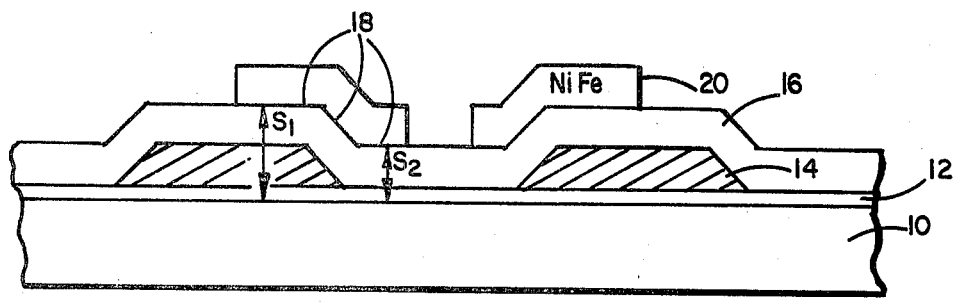
FIG. 1 is a cross-sectional view of a prior art microcircuit having a non-planar, two-level conductor pattern.

Referring now to FIG. 1, there is shown a cross-sectional view of a multiple-level conductor material pattern known in the art. Substrate 10 is of any suitable material, such as garnet for bubble memory fabrication. Substrate 10 is shown covered with a thin dielectric layer 12, such as silicon dioxide, on which is formed a first conductor pattern 14 typically of aluminum copper alloy. The first level conductor pattern 14 is shown covered by the dielectric layer 16, typically of silicon dioxide, having a contoured or non-planar surface 18. Second conductor pattern 20, typically of nickel iron alloy, is shown deposited on non-planar surface 18, illustrating non-uniform spacing $S_1$ and $S_2$ between the lower surface of the second conductor pattern material and the substrate 10. Non-uniform spacing contributes to lower device yield; however, the present invention method eliminates the illustrated non-uniformity in spacing.

Figure 2:
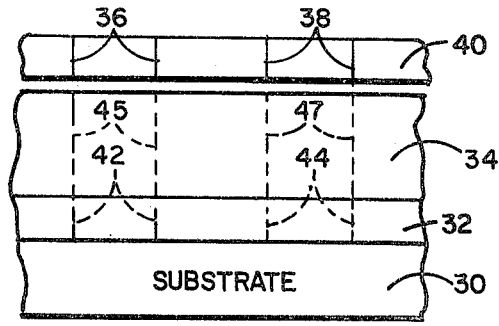
FIGS. 2 through 7 are cross-sectional views illustrating the various steps of the method of the present invention.

Referring now to FIGS. 2 through 9, there is shown and described a method of manufacturing microcircuits having multi-level conductor patterns. FIG. 2 shows substrate 30 on which is deposited a first insulator material layer 32 which in turn is coated with photoresist 34. Mask 40, having apertures 36 and 38 to define channel regions 42 and 44 in first insulator layer 32, is shown positioned above the photoresist material 34. Apertures 36 and 38 and mask 40 delineate the channel regions to be removed at 42 and 44 in first insulator material 32.

The first insulator material layer 32 is typically of silicon dioxide or aluminum oxide formed on substrate 30 using well known conventional methods of deposition such as described in U.S. Pat. No. 4,317,700, issued Mar. 2, 1982, column 2, line 25 through column 2, line 33, issued to K. Tanaka et al., and assigned to the common assignee.

Photoresist material 34 is of any suitable material such as Shipley's type AZ 1350J. The material is typically applied to a thickness of one micrometer by spin-casting or dipping. The photoresist material to be removed shown between the dotted line pairs 45 and 47 is first exposed using ultraviolet, x-rays, electron or ion beams, or other known techniques, and is then developed to permit subsequent etching.

Figure 3:
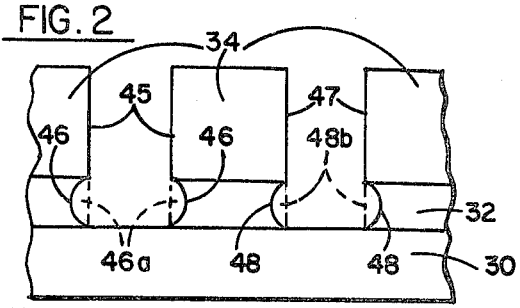

FIG. 3 illustrates the results of etching the insulator material 32 to define the channels 46 and 48 in a manner providing areas of over-etch. Etching may be accomplished using wet chemical, plasma, or reactive ion techniques to produce the slight over-etch effect. The hollow areas of over-etch are shown as regions 46a and 48b.

Figure 4:
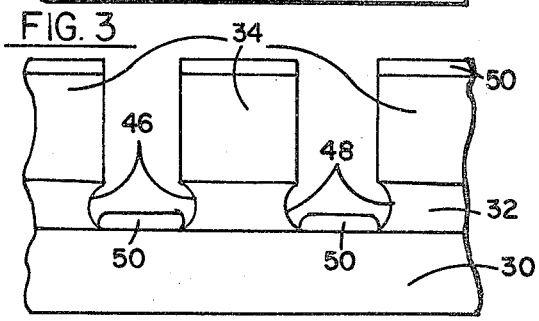

FIG. 4 shows a thin layer 50 of a further insulator material deposited on the common base 30 of the channels 46 and 48. The thin layer of a further insulator material 50 may be omitted in some applications. Insulator layer 50 is typically 200 to 500 angstroms thick silicon dioxide or the like, provided by using a standard E-beam deposition method over the entire device surface.

This layer is typically applied using well known techniques in the art such as vacuum evaporation and sputtering. Vacuum evaporation is performed by heating the material to be deposited in a vacuum using an electron beam or a refractory filament. The target material, such as schott glass, is heated to a temperature sufficiently high to cause the target material to boil and vaporize and thereafter deposit on the much colder substrate. Sputtering is achieved in a similar chamber having a vacuum into which a gas is introduced such as argon. The target material is charged to a negative potential and the surface to be plated is charged to a relatively positive potential. The potential difference used is selected to be sufficient to ionize the gas to form a plasma. Positive ions from the plasma then bombard the target material causing energetic ejection of target atoms which move through the plasma to condense on the surface to be plated. The deposition selected thereby coats the entire patterned, photoresist layer 34 as similarly discussed in U.S. Pat. No. 4,339,305, issued July 13, 1982, column 4, line 2 through column 4, line 22, issued to A. B. Jones and assigned to the common assignee.

Figure 5:
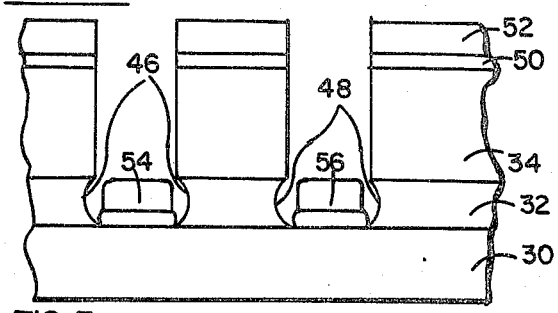

FIG. 5 shows the result of forming a first level conductor material pattern by vacuum deposition of conductor material 52 on the surface formed by further insulator material 50 and on the base of channels and 50. The conductor material forming the conductor material pattern is shown as 54 and 56 in the channels 46 and 48 respectively, to a thickness establishing co-planarity with the channel-defining first insulator material 32 and free of the over-etch areas 46a and 48b. The first level conductor material is typically an aluminum copper alloy of 96 percent aluminum and 4 percent copper having a thickness approximately 2500 angstroms.

The first level conductor material 54 is formed on the base of the overwide channels 46, 48 using vacuum evaporation or sputtering such as described above.

Figure 6:
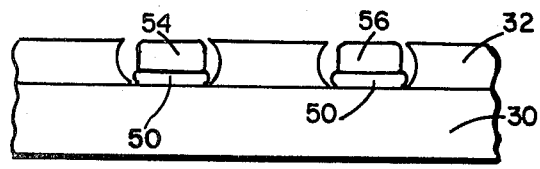

FIG. 6 shows the device from FIG. 5 after the lift-off process typically accomplished by soaking the device in warm acetone for a short time (e.g. 10 to 15 minutes). This soak is usually sufficient to swell and dissolve photoresist 34 layer such that it and any materials deposited thereon are removed.

Figure 7:
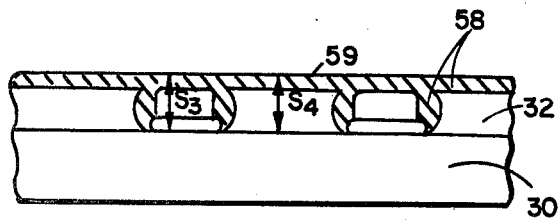

FIG. 7 illustrates the result the single step of the method of depositing an additional insulator material layer 58 atop the first level conductor material 54 and 56 and on the first insulator layer 32 in channel backfilling relation to completely fill the voids in the channel over-etch areas. The additional insulator material 58 defins a planar surface 59 uniformly spaced above the substrate 30. $S_3$ and $S_4$ illustrate uniform spacing between surface 59 and substrate 30 in comparison with non-uniform spacing, $S_1$ and $S_2$, shown in FIG. 1 between surface 18 and substrate 10.

Figure 8:
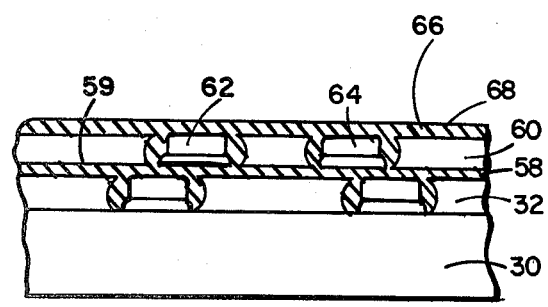
FIG. 8 is a cross-sectional view of a microcircuit having planar two-level conductor patterns in stacked parallel plane relation to a substrate, and a planar surface according to the invention.

By repeating the sequence of steps illustrated in FIGS. 2 through 7, additional patterns of conductors e.g. 62 and 64 can be created in stacked parallel plane relation with the first pattern of conductor material 54 and 56, as shown in FIG. 8. FIG. 8 illustrates the result of forming a second upper level conductor material pattern 62 and 64 at least partially opposite to the first level conductor material pattern 54 and 56 on the additional insulator material surface 59. The surface 59 uniformly spaces the second upper level conductor material pattern relative to the substrate. FIG. 8 also shows planar surface 66 defined by top insulator layer 68 on which yet additional conductor layers may be formed. Insulator layer 60 corresponds in function to first insulator material layer 32.

Figure 9:
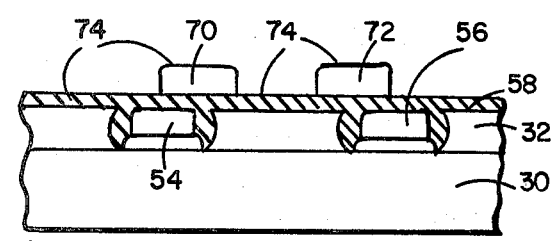
FIG. 9 is a cross-sectional view of a microcircuit having planar two-level conductor patterns in stacked parallel plane relation to a substrate, and a non-planar topmost surface according to the invention.

Backfilling the additional insulator layer 58 to sufficient thickness, i.e. to approximately 3000 angstroms, of $SiO_2$ or polymer material, permits channels to be formed directly in layer 58 to receive conductors 62 and 64 thereby eliminating the additional step of depositing insulator layer 60.

Where the topmost surface 74 of the device need not be planar, e.g. FIG. 9, but the conductor patterns are required to be in stacked parallel plane relation with pre-determined and uniform, spaced relation to the substrate and to the other conductor plane, e.g., as in bubble memory devices, the additional insulator material 58 is typically formed with a 500 angstrom thick layer of $SiO_2$, followed by a 3000 angstrom thick patterned and etched layer of nickel iron alloy. FIG. 9 shows the typical relationship between the first level conductor material pattern 54 and 56 and a second upper level conductor material pattern 70 and 72.

There is thus provided a method of producing multiple-level conductor material patterns having the advantage of co-parallel or stacked parallel conductor planes, embedded in insulator material, and having constant and uniform separation between pattern levels. The embodiment provided includes many specific dimensions and materials. However, the description is intended to be illustrative only and is not intended to be limitative. Those skilled in the art may conceive of modifications to the specific materials and parameters which are described. However, any such modifications which fall within the purview of the description are intended to be included therein as well. The scope of this invention instead shall be determined from the scope of the following claims including their equivalents.

What is claimed is:

1. A method of manufacturing microcircuits having multi-level, uniformly spaced, dielectrically isolated conductor patterns on a planar substrate, which includes:
    (1) forming a first insulator material layer on a planar surface of said substrate,
    (2) selectively masking said first insulator material layer to define pre-configured, channel regions to be etched in said first insulator material layer,
    (3) etching away said first insulator material mask defined regions to form relatively overwide channels by providing areas of overetch in the walls of said relatively overwide channels,
    (4) forming a first level conductor material pattern in aid channels with the top of said conductor material being substantially co-planar with the top surface of the channel-defining first insulator material and with said conductor material being free of contact with the overetch areas,
    (5) depositing additional insulator material atop said first level conductor material and said first insulator layer backfilling said channel overetch areas with said additional insulator material, said additional insulator material defining a planar surface uniformly spaced above said substrate and thereafter, (6) forming a second level conductor material pattern at least partially overlaying said first level conductor material pattern on said additional insulator material planar surface.

2. The method according to claim 1, including also interposing a thin layer of a further insulator material between the first level conductor material pattern and the base of said relative overwide channels.

3. The method according to claim 2 wherein said substrate is a garnet wafer.

4. The method according to claim 1 or 2, including also, repeating step (1) through (5) in sequence after step (5) for each conductor material pattern desired in excess of one.

5. The method according to claim 1 or 2, including also, repeating step (2) through (5) in sequence after step (5) for each conductor material pattern desired in excess of one.

6. The method according to claim 4 or 5, including also, forming a topmost conductor pattern to the topmost planar additional insulator surface.

7. The method according to claim 1 wherein said substrate is a garnet wafer.

8. The method according to claim 7, including also defining the second level conductor material pattern with a ferro-magnetic material.

9. The method according to claim 8, including also, defining the second level conductor material pattern with a nickel iron alloy.

10. The method according to claim 7, including also forming said first insulator material layer of silicon dioxide.

11. The method according to claim 7, including also forming said additional insulator material layer of silicon dioxide.

12. The method according to claim 7, including also masking said first insulator layer with photoresist, and effecting both said etching step and said first level conductor pattern forming step through said mask.

13. The method of claim 1 or 2, including also applying said additional insulator material by spin-casting or dipping.

14. The method according to claim 1 or 2, including also drying and sintering a liquid suspension of glass particles simultaneously witnhin the channels of and upon the surface of the first insulator material, layer, to define said additional insulator material layer.

15. The method according to claim 1, including also after step (1), depositing a uniform layer of photoresist material on said first insulator material layer surface, and including after step (4), dissolving said photoresist layer and lifting off all materials thereon.

16. The method of manufacturing microcircuits having multi-level conductor patterns which includes:
forming a first insulator material layer on the surface of a substrate,
selectively masking said first insulator material layer to define channel regions in said first insulator material,
etching said first insulator material layer to define said channels in a manner providing areas of overetch,
forming a first level conductor material pattern in said channels to near co-planarity with the channel-defining first insulator material and freely of overetch areas,
depositing additional insulator material atop said first level conductor material and said first insulator layer in channel backfilling relation, said additional insulator material defining a planar surface uniformly spaced above said substrate,
forming a second upper level conductor material pattern on said additional insulator material surface;
whereby, said second upper level conductor material pattern is uniformly spaced from said first level conductor material pattern and from said substrate.

17. The method according to claim 7, including also forming said first insulator material layer of polymer material.

18. The method according to claim 7, including also forming said additional insulator material layer of polymer material.

* * * * *